United States Patent [19]

Foley

[11] Patent Number: 4,776,745
[45] Date of Patent: Oct. 11, 1988

[54] SUBSTRATE HANDLING SYSTEM

[75] Inventor: Michael S. Foley, Beverly, Mass.

[73] Assignee: The United States of America as represented by the Secretary of the Air Force, Washington, D.C.

[21] Appl. No.: 7,212

[22] Filed: Jan. 27, 1987

[51] Int. Cl.⁴ .............................................. C23C 13/08
[52] U.S. Cl. .................................... 414/217; 414/751; 414/22.2; 414/609; 414/416; 414/286; 414/331; 414/749; 118/729; 118/500; 118/50; 187/16
[58] Field of Search ............... 414/754, 757, 331, 222, 414/225, 226, 416, 28, 217, 286, 608, 609, 749, 751; 187/16; 118/729, 730, 733, 50, 50.1, 500

[56] References Cited

U.S. PATENT DOCUMENTS

| | | | |
|---|---|---|---|
| 4,147,432 | 4/1979 | Yamawaki et al. | 118/733 X |
| 4,178,113 | 12/1979 | Beaver, II et al. | 414/416 X |
| 4,278,380 | 7/1981 | Guarino | 118/733 X |
| 4,542,712 | 9/1985 | Sato et al. | 414/217 X |
| 4,558,983 | 12/1985 | Freeman et al. | 414/331 |
| 4,558,984 | 12/1985 | Garrett | 414/331 X |
| 4,605,469 | 8/1986 | Shih et al. | 118/729 X |
| 4,632,624 | 12/1986 | Mirkovich et al. | 118/733 X |
| 4,643,629 | 2/1987 | Takahashi et al. | 414/416 X |
| 4,685,852 | 8/1987 | Rubin et al. | 414/416 X |

Primary Examiner—Frank E. Werner
Attorney, Agent, or Firm—William G. Auton; Donald J. Singer

[57] ABSTRACT

A substrate handling system supplies new wafers to a vacuum chamber containing a lithography system, and outputs processed semiconductor wafers to an environment with normal atmospheric pressure. New wafers on a transplate pass by way of an air film track to a transload which feeds them from a load platform to a vacuum lock elevator. The inner door of the vacuum lock elevator opens and a completed transplate is transferred to the top shelf of the vacuum lock elevator. Next the vacuum lock elevator lifts to its upper position and the subsequent transfer of a new transplate onto a worktable occurs. There follows the closing of an inner door, (venting of the vacuum lock), the opening of an outer door, and the insertion of a new transplate from the load platform to the bottom shelf of the elevator. Finally, the completed transplate is removed. In cases where negative photoresists are used, this last step is replaced by routing the transplate to the post cure chamber for a period of up to 30 minutes.

6 Claims, 9 Drawing Sheets

SUBSTRATE HANDLING SYSTEM

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to systems which fabricate semiconductor wafers, and more specifically to a device which provides a rapid transfer of semiconductor wafers into and out of the vacuum chamber of an electron beam lithography system.

The development of the direct-write e-beam lithography system poses a number of challenging requirements in the area of substrate handling. Silicon substrates must be routinely and rapidly transferred between a vacuum chamber and an environment characterized by room temperature and normal atmospheric pressure.

Perhaps the most significant challenge is posed by the throughput requirements for semiconductor wafer production. For example, a rate of ten to fifteen substrates per hour represents an order of magnitude of throughput increase over existing e-beam fabrication systems. For practical purposes, this rate precludes the conventional use of hand-loaded cassettes, indicating total automation of the load function is required. The substrate loader must be a carrier-to-carrier system, requiring no human contact with substrates.

The task of providing a rapid transfer of semiconductor substrates into a lithography system to generate sub-micron device geometries is alleviated, to some extent, by the systems disclosed in the following U.S. Patents, the disclosures of which are incorporated by reference:

U.S. Pat. No. 3,954,191 issued to Wittkower et al;
U.S. Pat. No. 3,968,885 issued to Hassan et al;
U.S. Pat. No. 4,009,785 issued to Trayes;
U.S. Pat. No. 4,047,624 issued to Dorenbos;
U.S. Pat. No. 4,293,249 issued to Whelan; and
U.S. Pat. No. 4,425,075 issued to Quinn.

Hassan et al disclose a method and apparatus for handling semiconductor wafers which are moved into and out of a vacuum chamber. Pattern writing by an electron beam produces precise patterns on the wafer chips. Rapid transfer of workpieces is achieved with an elevator that functions as a transfer mechanism from an antechamber to a vacuum chamber.

Wittkower et al teach an isolation lock through which wafers can move in a path between first and second regions at different pressures. The patented vacuum lock comprises a housing having an upper wafer entrance and a lower wafer exit at opposite sides of the housing, and a piston in the housing with a wafer receiving surface. A pressure lock for handling workpieces is also shown in the Dorenbos patent.

Whelan discloses a semiconductor handling system operated by a computer and including a track of air or gas for moving the semiconductor slices along. An air track for semiconductor wafers is also shown in the Trayes patent. In Quinn the wafers are aligned by means of air jets.

While the systems in the above-cited references are instructive, the need remains to provide a system for the rapid transfer of a production line of semiconductor wafers into and out of the vacuum chamber of an electron beam lithography system. The present invention is intended to satisfy that need.

SUMMARY OF THE INVENTION

The present invention is a substitute handling system which conducts semiconductor wafers into and out of an electron beam lithography system which operates in a high vacuum. This system requires no human contact so that particulate contamination does not occur. It includes: a transplate/fixture, a feedline, a transload, a two level vacuum lock, and a post cure chamber.

Silicon substrates are loaded into the substrate handling system by a substrate elevator, which supplies them one at a time to an input track of the feedline. The input track may be a conveyor belt or a chute whose perforated floor provides an air film to conduct the silicon substrates to the transfer/load mechanism (transload) which fastens each of them on a transfer plate (transplate) for lithographic processing.

Each transfer plate is an individual tray with clamps which fasten onto a silicon substrate to hold it in a fixed position. The transfer/load mechanism moves each silicon substrate from the input track onto an individual transfer plate; retracts and applies the transfer plate clamps to the substrate; and moves the transfer plate (loaded with a silicon substrate) to the two level vacuum lock.

At this point, all of the operations described above have been conducted at atmospheric pressure. The two level vacuum lock receives transfer plates at normal atmospheric pressure, and delivers them to a vacuum work chamber for lithographic processing. The two level vacuum lock has an inner vacuum door, an outer vacuum door, an internal elevator, and a vacuum venting mechanism. After the electron beam lithography system processes the substrates, the vacuum lock then returns these semiconductor wafers back to an environment with normal atmospheric pressure.

The post cure chamber is an optional element of the present invention which is used to receive and temporarily store up to 8 transplates which are loaded with substrates coated with negative resists. The post cure chamber includes a 7 position elevator which, when needed, receives the loaded transplates directly from the two level vacuum lock mechanism.

The system described above can supply photomask plates and silicon wafers to and from the vacuum chamber environment of an electron beam lithography system for the production of semiconductor wafers with sub-micron geometrics at a high throughput rate. Accordingly, it is an object of the present invention to transfer silicon substrates rapidly between an environment with normal atmospheric pressure and a vacuum chamber.

It is another object of the present invention to load silicon substrates onto transfer plates to facilitate the fabrication of semiconductor wafer fabrication.

These objects, together with other objects, features and advantages of the invention will become more readily apparent from the following detailed description when taken in conjunction with the accompanying drawing wherein like elements are given like reference numerals throughout.

DETAILED DESCRIPTION OF THE PREFERRED EMBODIMENT

The present invention is a device which provides a rapid transfer of semiconductor wafers into and out of the vacuum chamber of an electron beam lithography system.

Figure 1:
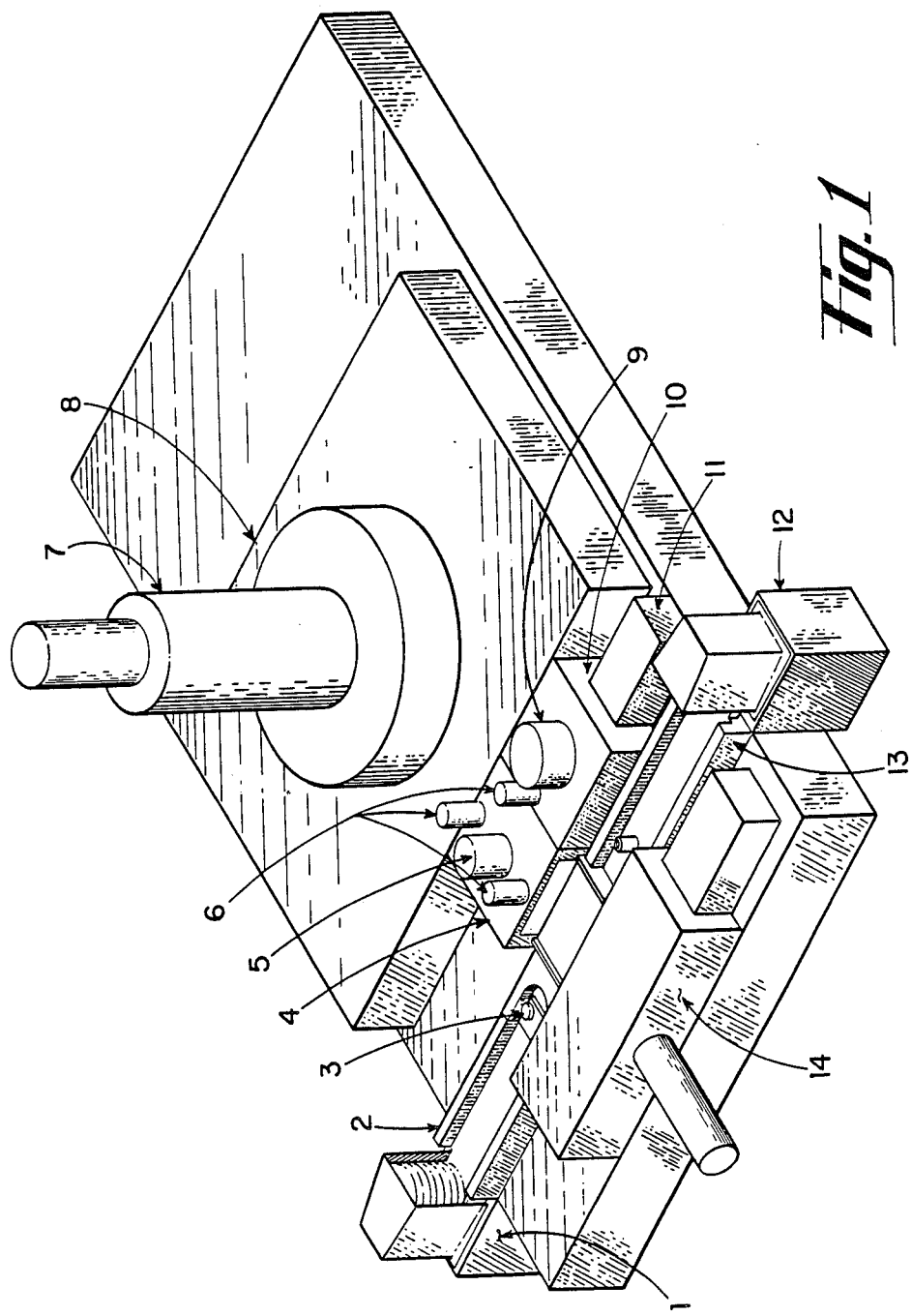
FIG. 1 is an illustration of the preferred embodiment of the present invention.

The reader's attention is now directed towards FIG. 1, which is an illustration of the preferred embodiment of the substrate handling system of the present invention, which comprises: an input elevator 1, a feed line which includes an input track 2, a wafer orientator 3, the two level vacuum lock 4, the transfer/load mechanism 14, and the output track 13.

As mentioned above, silicon substrates are loaded into the system by the input elevator 1, which supplies them one at a time to the input track 2. A detailed discussion of an embodiment of this input elevator is presented below in conjunction with the discussion of a figure which depicts an elevator suitable as both the input elevator 1 and output elevator 12. Additionally, it is important to note that every major subsystem of the system of FIG. 1 is illustrated in one of the figures and is described in detail below.

The feedline of the system of FIG. 1 includes the input track 2 and the output track 13. Both of these tracks may be either a conventional conveyor belt or a chute whose perforated floor provides a stream of air to move the silicon substrate along guide rails to their destination. The input track 2 conducts silicon substrates from the input elevator 1 to the transfer/load mechanism 14, where each silicon substrate is fastened onto a transfer plate for lithographic processing. Details of the transfer plates as well as the transfer/load mechanism 14 itself are presented below in descriptions of figures which illustrate them.

Once a substrate is loaded on a transfer plate, the transfer/load mechanism 14 places the loaded transfer plate in the two level vacuum lock elevator 4 so that the substrate can be conducted into the vacuum work chamber 8 for processing into a finished semiconductor wafer by the electron beam lithography system based therein. While electron beam lithography systems are known in the art and need not be described here, the two level vacuum lock elevator 4 is described in detail below.

Once a substrate is processed into a finished semiconductor wafer, the two level vacuum lock elevator 4 is used to transfer the wafer from the vacuum work chamber 8 back out to the transfer/load mechanism 14, which removes the transfer plate and places the finished semiconductor wafer on the output track 13 of the feed line. The output track 13 has the same features as the input track 2. It may be either a conventional conveyor belt, or a chute whose perforated floor provides a stream of air to move the semiconductor wafers to the output elevator 12.

The output elevator 12 has the same features as the input elevator 1. The descriptions of both elevators are provided in detail below in a discussion of a figure which illustrates an embodiment of them.

As mentioned above, an optional element of the present invention is the post cure chamber 10, which is used to receive and temporarily store up to eight transplates which are loaded with substrates coated with negative resists. The post cure chamber 10 of FIG. 1 is a seven position elevator which can receive loaded transplates directly from the two level vacuum lock 4 and store them for a period of up to 30 minutes. The post cure chamber, like the other elements of the system, is discussed in detail below.

Figure 2:
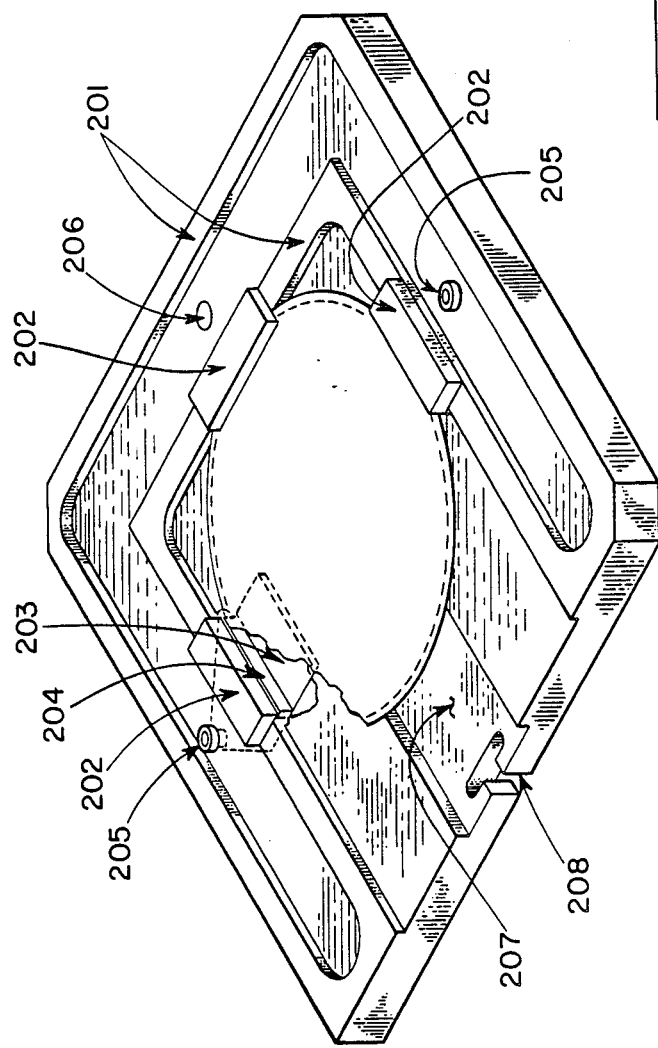
FIG. 2 is an illustration of a transfer plate use in the present invention.

FIG. 2 is an illustration of an individual transfer plate of the present invention with a silicon substrate 200 clamped onto it. Although a silicon wafer is shown clamped in the transfer plate, it should be understood that photomask plates may be held by a similar arrangement. The upper surface 201 of the transplate is lapped flat to within the required tolerance. Top confiner plates 202 provide topside registration for the substrate along three edges. Flat cantilevered springs 203 attached to the bottom load blades 204 against the substrate. Springs are opened by air driven pins which enter through bores (205 and 206). Bores marked 205 are lined with bushings which permit precision registration of the transplate on the load platform. The milled recess 207 at the center of the transplate provides clearance for entry of the transload vacuum pick, while the keyslot 208 provides pulling surfaces for transplate movement.

Typical silicon substrates, used with the transfer plate of FIG. 2, have the following diameters: 2", 3", 80 mm, 90 mm, 100 mm (525 M and 625 M thicknesses), 125 mm and 150 mm. Typical photomask plates are square mask plates whose sides can have the following lengths: 2", 2½", 3", 4", 4½", 5", 6", and 7". Maximum thickness is about 0.25 inches with the transfer plate of FIG. 2.

While FIG. 2 is an illustration of a transfer plate designed for use with the present invention, there exist commercially available silicon wafer carriers that may be used. For example, the "Flouroware" A72-M series teflon or polypropylene carriers may be used.

Figure 3:
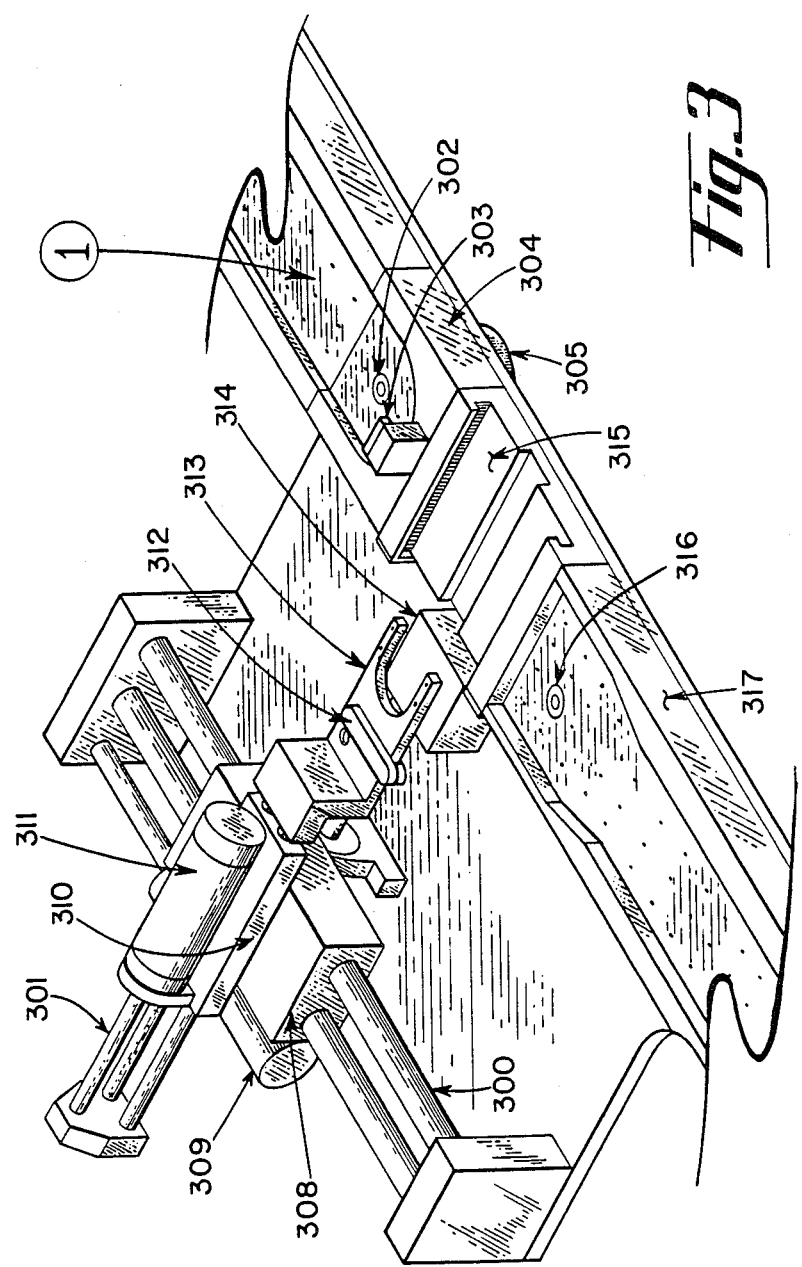
FIG. 3 is an illustration of the transfer load mechanism used in the system of FIG. 1.

FIG. 3 is an illustration of the transfer/load mechanism of the present invention. The function of the device is to transfer substrates from the end of the input track 1 onto the load platform 315, to clamp it to a transfer plate for lithographic processing, and after processing transfer the finished semiconductor wafer to the end of the output track 317. The transfer/load mechanism of FIG. 3 accomplishes this task using a vacuum pick arm 313, the load platform 315, a spring-loaded roller arm 312, an arm placement mechanism 308-311, and a set of arm placement guide rails 300.

The vacuum pick arm 313 applies a mild suction to silicon substrates to lift them when they are in proximity with it. The task of moving the vacuum arm to proximity with silicon substrates is the task of the arm placement mechanism 308-311, which slides back and forth along the guide rails 300, and extends and retracts the vacuum pick arm 313 as follows. Air cylinder 309 receives control signals from the system user to position a first roller 308 into one of these three positions, an input position, a middle position, and an output position. When roller 308 is in the input position, the vacuum pick arm 313 is aligned with the end of the input track 1 so that it can pick up a silicon substrate.

When roller 308 is in the middle position, the vacuum pick arm is aligned with the load platform 315 so that a semiconductor substrate may be fastened to a transfer plate (by a procedure discussed below). When roller 308 is in the middle positioned the vacuum pick arm 313 may also extract a finished semiconductor from a transfer plate.

When roller 308 is in the output position, the vacuum pick arm 313 is aligned with the end of the output track 317, so that a finished semiconductor wafer may be sent on its way to the output elevator of FIG. 1.

A second air cylinder 311 receives control signals from the system user to pneumatically move a second roller 310 along a second set of rails 301. This movement serves to extend and retract the vacuum pick arm into position over: the end of the input track, the end of the output track, and over the load platform 315.

The vacuum pick arm 313, when fully retracted is capable of depositing and picking up loaded transfer plates to and from the transfer shuttle 314. The transfer shuttle 314 is schematically illustrated in FIG. 3, and is the means by which loaded transfer plates are transported to and from the two level vacuum lock elevator 4 of FIG. 1. A variety of alternatives too numerous to mention exist that can serve as the transfer shuttle. For an example, the transfer shuttle 314 may be a simple conveyor belt which rolls in the direction of the two level vacuum lock elevator to deliver loaded transplates; and which rolls in the direction of the vacuum pick arm 313 to return the finished semiconductor wafer after processing. See references cited above for example of conveyor systems.

Referring back to FIG. 2, the reader is reminded that each transfer plate has a set of top confiner plates which are spring-loaded, and which clamp a silicon substrate 200 in position on the plate. The clamps are released when air driven pins enter through bores 205 and 206 and push them open. In the illustration of FIG. 3, these pins are pneumatically driven pins which are fixed in the bed of the load platform 315 of the transfer load mechanism. These pins need not be described in further detail other than to state that they are driven by a pneumatic system which is controlled by the user of the invention to clamp and release silicon substrates on the transfer plate as required.

Figure 4:
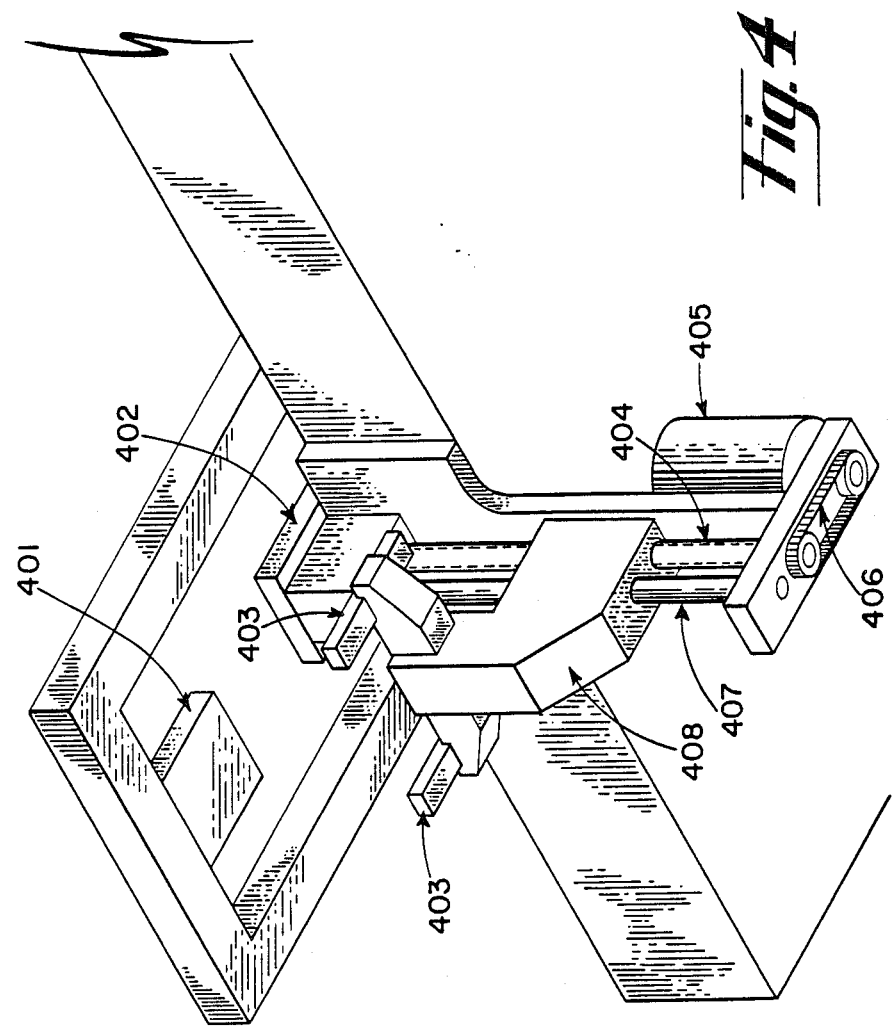
FIG. 4 is an illustration of a substrate elevator used in the system of FIG. 1.

FIG. 4 is an illustration of a substrate elevator suitable for use as both the input elevator 1 as well as the output elevator 12 in the system of FIG. 1. The view of FIG. 4 shows the elevator 403-408 mounted beneath the feed line 401-402 so that the carrier arms 403 might lift a silicon substrate up to the feed line through an H-shaped aperture. When the input track and output track generate an air stream in the manner discussed above, the air stream will automatically move the silicon substrate to and from the carrier arms 403 when they are lifted into position.

The elevator of FIG. 4 includes a motor 405, fan belt drive system 406, drive screw 404, slider 408, vertical shaft 404, and two carrier arms 403. The motor 405 is operated under the control of the user of the system to turn the fan belt drive system 406 which, in turn, rotates the drive screw 404 to raise and lower the slider 408 along the vertical shaft 407.

Figure 5:
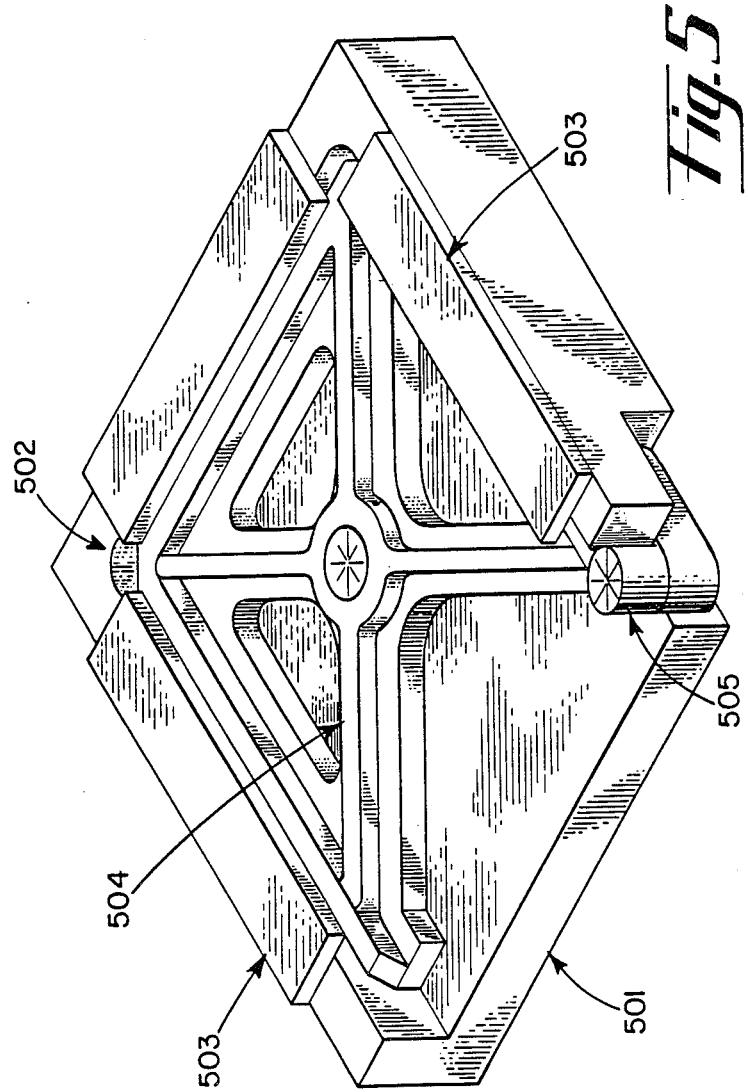
FIG. 5 is an illustration of the work table fixture housed in the vacuum chamber.

FIG. 5 is an illustration of a work table fixture which is housed in the vacuum chamber and which holds a loaded transplate so that the electron lithography system can process the silicon substrate. The purpose of both the work table fixture as well, as the transplate, is to hold the silicon substrates in a known position which is fixed with respect to the lithography system. This enables an automated lithography system to "know" where the substrate is and facilitate the processing.

The work table fixture of FIG. 5 includes the main body 501 of the fixture which attaches to the worktable on three adjustable jack screws (not shown). The upper surface of the main body is lapped flat to establish the writing plane. Top confiner plates 503 provide topside registration for the transplate, while the ribbed structure below 504 provides loading against the confiner plates. The spring loaded roller arm 505 registers the transfer plate in the opposite corner.

Figure 6:
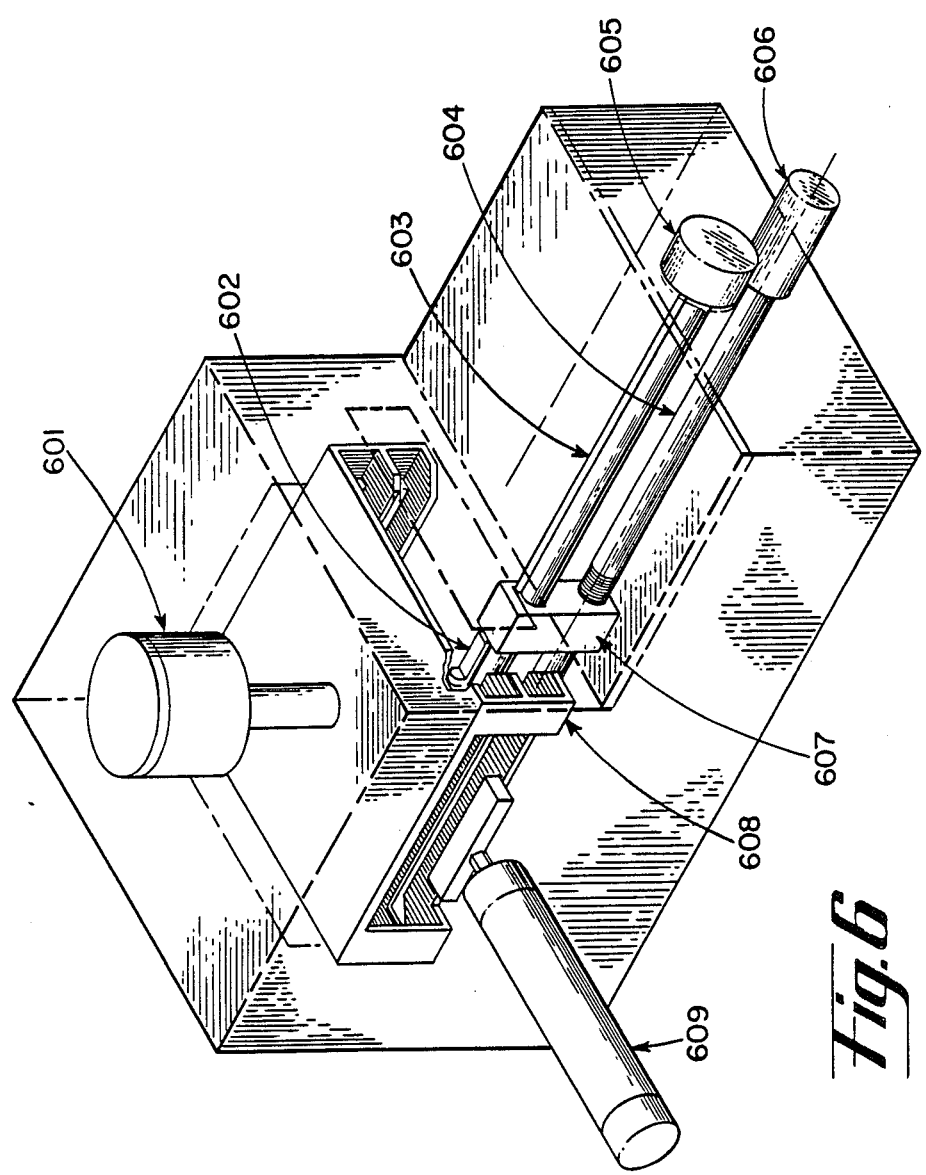
FIG. 6 is an illustration of the two level vacuum lock elevator used in the system of FIG. 1.

FIG. 6 is an illustration of the two level vacuum lock elevator 4 of the system of FIG. 1. The elevator frame 608 is a two-position device, the operation of which is illustrated in FIGS. 7A-D.

Figure 7A:
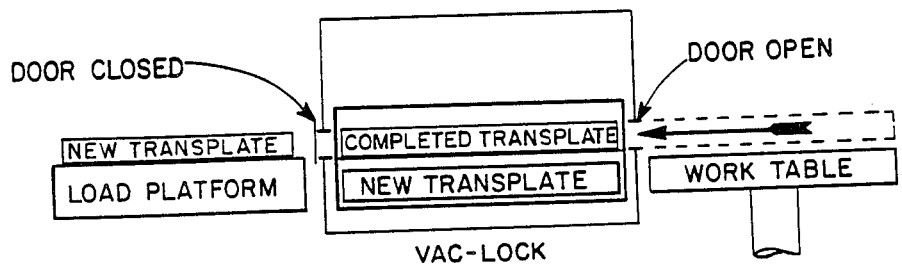
FIGS. 7A-7D are diagrams depicting the operation of the system of FIG. 6.
Figure 7B:
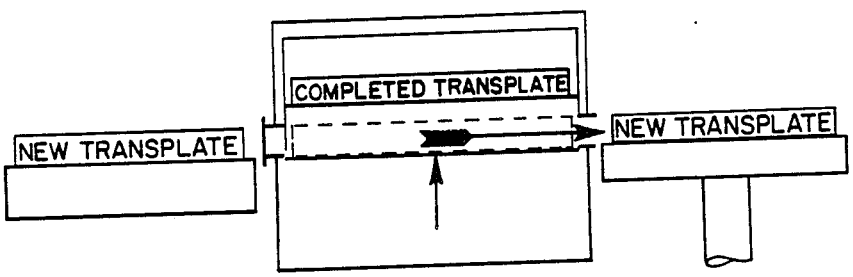
Figure 7C:
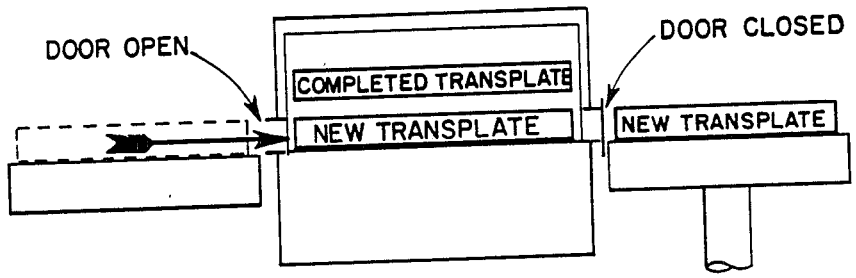
Figure 7D:
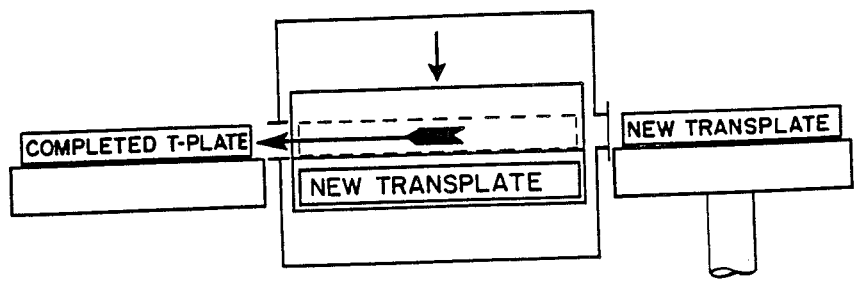

FIG. 7A indicates the condition which exists following the completion of electron beam lithography on a completed transplate while a new transplate is in need of processing. At this time, as shown in FIG. 7A, the work chamber door opens and the completed transplate is transferred to the top shelf of the vac-lock elevator. FIG. 7B shows the lifting of the vac-lock elevator to its upper position and the subsequent transfer of the "new transplate" onto the worktable. FIG. 7C shows the closing of the inner door, (the venting of the vac-lock vacuum), the opening of the outer door, and the insertion of the "new transplate" from the load platform to the bottom shelf of the elevator. Lastly, FIG. 7D shows removal of the "completed transplate." In cases where negative photoresists are used, this last step is replaced by routing the transplate to the post cure chamber for a period of up to 30 minutes.

Referring back to FIG. 1, the "completed transplate" is now in position to be unloaded. The vacuum pick (with vacuum on) enters beneath the substrate, the substrate is released from the transfer plate and lifted by the pick. The pick then executes another horizontal "pick and place" motion, bringing the substrate into position above the unload track vacuum chuck. The pick vacuum is vented and the chuck vacuum is turned on, removing the substrate from the pick. The pick then retracts, allowing the vacuum chuck to lower the wafer onto the output air track 13. The track's directional air film carries the substrate to the output elevator 12. The output elevator 12 lifts the substrate off the track to complete the process.

The system of FIG. 6 accomplishes the procedure of FIGS. 7A-7D using the two-position elevator frame as follows. Vertical motions are obtained from the air cylinder 601, while shuttle motions are done by air cylinder 600 (vac-lock to post cure), and the shuttle finger 602 (vac-lock to work chamber). The finger slide 607 rides on the vee groove rod 603 and is driven (and guided) by the drive screw 604. The small gear motor 606 drives the screw, and the rotary solenoid 605 serves to rotate the vee groove shaft and engage the transplate finger.

Figure 8:
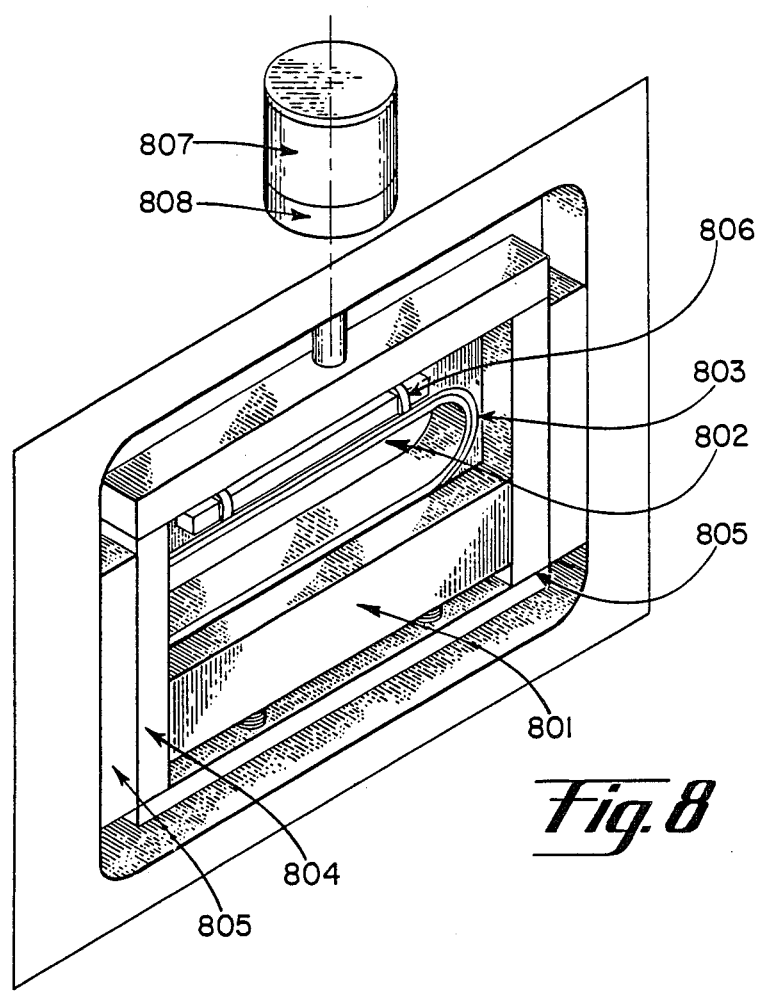
FIG. 8 is an illustration of the vacuum chamber door of the system of FIG. 6

FIG. 8 is an illustration of the vacuum chamber door used on both the work chamber door (inner door) and the outer door of the two level vacuum lock system of FIGS. 6 and 7A–7D. The system of FIG. 8 is a modified version of a commercially available Ee-BES-40 vacuum door which works as follows. The sealing plate 801 closes off the chamber opening 802, sealing against the o-ring 803. Vertical motion is provided by the air cylinder 807 through a vacuum seal 808. Loading of the sealing plate against the o-ring is caused by a set of rollers and slots (not shown) integral with the guide gibs 805 and the main frame 804. This configuration is used because of its proven effectiveness and also because of potential interference problems occurring if the current Ee-BES design were used on the direct-write lithographic system.

Figure 9:
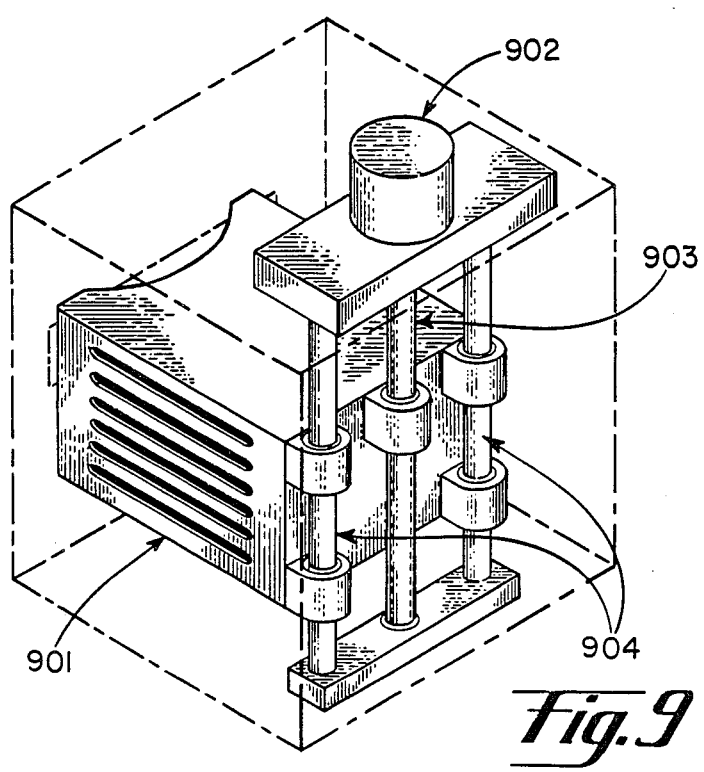
FIG. 9 is an illustration of the post cure chamber of the system of FIG. 1.

FIG. 9 is an illustration of the post cure chamber elevator mechanism. It is a seven position elevator, providing storage for up to 8 transplates. The main elevator frame 901 holds the transplate stack on internal guides (not shown). Vertical drive motion is provided by the motor 902 driven screw 903, while shafts 904 act as guides.

As mentioned earlier, the post cure chamber elevator is an optional portion of the present invention. Another optional portion of the invention is the wafer orienter subsystem 302–305 of the transfer/load system of FIG. 3. The purpose of the wafer orienter subsystem is as follows. When the substrate is a silicon wafer, the orienter rotates it under a retroreflective light emitting diode (LED) array 303 to orient a primary flat surface of the wafer to within ±5°. This is initiated when silicon wafers float into the semicircular pocket on an air film. After settling, the vacuum chuck 302 lifts the wafer up to the LED array in order to find the primary flat surface. (The accuracy of orientation is to be ±5°). After finding the flat the orienter reorients the flat, bringing it into proper radial orientation for loading the transplate.

The retroreflective array 303 includes at least one transmitting light emitting diode (which serves as an emitter) and a detecting light emitting diode which detects light reflected from the silicon wafer. When the primary flat surface of the silicon wafer faces the array 303, the detected amounts of retroreflected radiation reach their maximum intensity.

The use of light emitting diode arrays, both as emitters and as light detectors, is deemed to be known in the art and need not be described further herein. For a more detailed description see the text entitled "Semiconductor Lasers and Heterojunction LEDs" by H. Kressel and J. Butler, published in 1977 by Academic Press, the disclosure of which is incorporated herein by reference.

Figure 10:
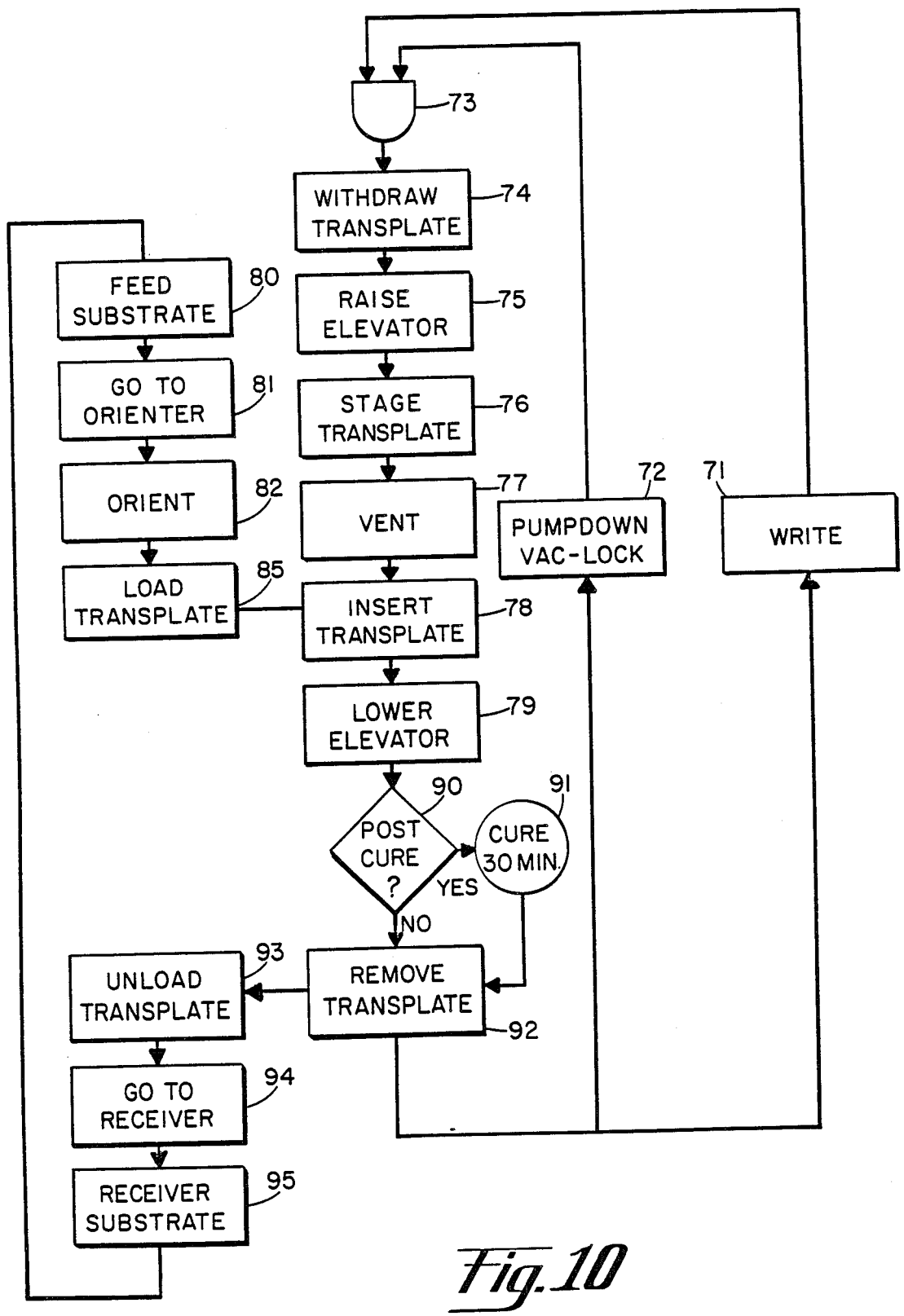
FIG. 10 is a block diagram of the general process followed by the system of FIG. 1.

Many of the subsystems of FIG. 1 have been described as "being controlled by control signals from the user of the system." For a truly automated system, these control signals would actually emanate from a microprocessor, which would serve as a system controller. FIG. 10 is a functional block diagram of the process of the present invention. This figure can serve as the basis for programming the system controller as follows.

Once the electron beam lithography system has completed its write function 71 and the two level vacuum elevator is depressurized 72, the AND gate outputs a "complete" signal which indicates that the completed semiconductor wafer may be withdrawn 74 into the two level vacuum elevator, and sent on its way.

FIG. 10 suggests that while the processed semiconductor wafer is being withdrawn 74, a new semiconductor substrate should be fed into the system 80 (by the input elevator and input track of the system); oriented 81, 82 by the orienter subsystem; and loaded onto a transplate 85 by the transplate/load mechanism.

Once the two-level vacuum elevator is vented 77 to reach atmospheric pressure, and the new transplate loaded on one level of the two level elevator 78, the processed transplate (still on the elevator) will be sent to the post cure chamber (if required) then unloaded from the two-level elevator and sent to the output track and output elevator of the system.

At this point, the two level elevator is again depressurized 72 and the new transplate processed by the electron beam lithography write system 72 in the vacuum chamber of the system.

The substrate handling system of the present invention provides rapid transfer of semiconductor wafers into and out of the vacuum chamber of an electron beam lithography system.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A substrate handling system, for use with a lithography system which is housed in a vacuum chamber, said substrate handling system receiving and supplying unprocessed substrates to said lithography system in said vacuum chamber, said substrate handling system receiving processed semiconductor wafers from said lithography system and outputting them into an environment with normal atmospheric pressure, said substrate handling system comprising:

a means for loading each of said unprocessed substrates onto a transfer plate, said loading means thereby outputting a first loaded transfer plate, which contains one of the processed semiconductor wafers, said loading means thereby outputting each of said processed semiconductor wafers at normal atmospheric pressure;

an elevator body with a first and second level, said first lever sequentially receiving each of the first loaded transfer plates from the loading means and outputting them to the lithoggraphy system in the vacuum chamber, said second level sequentially receiving each of the second loaded transfer plates from the lithography system in the vacuum chamber, and outputting them to the loading means;

a means for driving the elevator body so that its first and second levels align with said loading means and said lithography system so that the elevator body can receive and deliver the first and second loaded transfer plates as required;

first and second vacuum doors which are attached to and provide a vacuum seal for said elevator body, said first vacuum door allowing access to said elevator body by said loading means, said second vacuum door allowing access to said elevator body by said lithography system in said vacuum chamber; and a means for depressurizing and venting said elevator body so that it may receive said first loaded transplates at atmospheric pressure and deliver them to a vacuum chamber.

2. A substrate handling system, as defined in claim 1, including:

an input elevator which receives and incrementally outputs unprocessed substrates at atmospheric pressure;

an input track which receives and incrementally outputs said unprocessed substrates from said input elevator to said loading means;

an output track which receives and incrementally outputs said processed semiconductor wafers from said loading means; and an output elevator which incrementally receives said processed semiconductor wafers from said output track and outputs them at normal atmospheric pressure.

3. A substrate handling system, as defined in claim 2, wherein said loading means comprises:

a vacuum pick arm which picks up each unprocessed substrate from said input track and deposits it upon a transplate so that it can be fixed thereto, said vacuum pick arm picking up each processed semiconductor wafer, when it is detached from a second loaded transplate, and placing it on said output track; a means for attaching each of said unprocessed substrates, received from said vacuum pick arm, to a transfer plate to produce said first loaded transplate, said attaching means also detaching said processed semiconductor wafer from said second transplate so that it is accessible to said vacuum pick arm;

a means for positioning said vacuum pick arm in proximity with said input track, said output track, and said attaching means; and a means for transferring each first loaded tansfer plate from said attaching means to said two level vacuum lock elevator, and each second loaded transfer plate from said two level vacuum lock elevator to said attaching means.

4. A substrate handling system, as defined in claim 3, including a post cure chamber which receives and temporarily stores said second transfer plates from said two level vacuum lock elevator when the second transfer plates hold a processed semiconductor wafer coated with a negative resist.

5. A substrate handling system, as defined in claim 4, wherein each of said unprocessed substrates are a silicon substrate with a primary flat surface along one side, and wherein said output track includes a means for orienting the primary flat surface of the silicon substrate within about five degrees of a known direction, said orienting means thereby enabling said vacuum pick arm to place the silicon substrate on the transfer plate on the attaching means with proper radial orientation.

6. A substrate handling system, as defined in claim 5, wherein said orienting means comprises a retroreflective array which emits light onto said silicon substrate and detects retroreflected light from said silicon substrate, said retroreflective array thereby outputting a maximum amplitude detection signal when the primary flat surface of the silicon substrate directly faces the retroreflective array; and a means for rotating said silicon substrate, said rotating means being fixed in proximity with said retroreflective array and rotating said silicon substrate until said retroreflective array outputs said maximum amplitude detection signal, said rotating means then stopping with said silicon substrate having its primary flat surface facing said retroreflective array.

* * * * *